(12) United States Patent
Fai Lai

(10) Patent No.: US 6,217,716 B1
(45) Date of Patent: Apr. 17, 2001

(54) APPARATUS AND METHOD FOR IMPROVING TARGET EROSION IN HOLLOW CATHODE MAGNETRON SPUTTER SOURCE

(75) Inventor: Kwok Fai Lai, Berkeley, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 09/073,358

(22) Filed: May 6, 1998

(51) Int. Cl.⁷ .................................................... C23C 14/34

(52) U.S. Cl. .............................. 204/192.12; 204/298.18; 204/298.12; 204/298.16

(58) Field of Search .................. 204/298.12, 298.09, 204/298.16, 298.17, 298.18, 298.21, 298.22, 298.14, 192.12, 298.2, 298.03

(56) References Cited

U.S. PATENT DOCUMENTS

| | | | |
|---|---|---|---|
| 3,616,450 | 10/1971 | Clark | 204/298.17 |
| 3,669,871 | 6/1972 | Elmgren et al. | 204/298.12 |
| 3,711,398 | 1/1973 | Clarke | 204/298.17 |
| 3,829,373 | 8/1974 | Kuehnle | 204/298.24 |
| 3,878,085 | 4/1975 | Corbani | 204/298.19 |
| 3,884,793 | 5/1975 | Penfold et al. | 209/298.16 |
| 3,897,325 | 7/1975 | Aoshima et al. | 204/298.06 |
| 4,046,660 | 9/1977 | Fraser | 204/192.12 |
| 4,060,470 | 11/1977 | Clarke | 204/192.12 |
| 4,100,055 | 7/1978 | Rainey | 204/298.12 |
| 4,116,793 | 9/1978 | Penfold et al. | 204/192.12 |
| 4,166,018 | 8/1979 | Chapin | 204/192.12 |
| 4,356,073 | 10/1982 | McKelvey | 204/192.12 |
| 4,385,979 | 5/1983 | Pierce et al. | 204/298.09 |

(List continued on next page.)

FOREIGN PATENT DOCUMENTS

| | | | |
|---|---|---|---|
| 0 163 445 | 12/1985 | (EP) | H01L/21/203 |
| 0 163 446 | 12/1985 | (EP) | H01L/21/203 |
| 0 173 164 | 3/1986 | (EP) | H01L/21/203 |
| 0 210 473 | 2/1987 | (EP) | H01J/37/34 |
| 0 439 361 | 7/1991 | (EP) | H01J/37/34 |
| 2 129 021 | 5/1984 | (GB) | C23C/15/00 |
| 57-194255 | 11/1982 | (JP) | C23C/15/00 |
| 61-190070 | * 8/1986 | (JP) | 204/298.21 |
| 63-024054 | 2/1988 | (JP) | C23C/14/06 |
| 1-116071 | * 5/1989 | (JP) | 204/298.18 |
| 2-004965 | 1/1990 | (JP) | C23C/14/35 |
| 3-285067 | * 12/1991 | (JP) | 204/298.2 |
| 81/03345 | 11/1981 | (WO) | C23C/15/00 |

OTHER PUBLICATIONS

Blaas, et al., "A Hot Cathode Magnetron Discharge for Hollow Cathode Arc Ignition", 1970, Annalen der Physik, 7 Folge, Band 24, Heft 3/4.

Cuomo, et al., "Hollow–Cathode–Enhanced Magnetron Sputtering", May/Jun. 1986, J. Vac. Sci. Technol., vol. 4, No. 3.

Fraser, et al., "Film Deposition With The Sputter Gun", Jan./Feb./ 1977, J. Vac. Sci. Technol., vol. 114, No. 1.

(List continued on next page.)

Primary Examiner—Nam Nguyen
Assistant Examiner—Gregg Cantelmo
(74) Attorney, Agent, or Firm—Roland Tso

(57) ABSTRACT

Magnetic field lines within a hollow cathode magnetron sputtering device are modified by various means to improve the full-face erosion profile of the hollow cathode target. These means include, varying the magnetic field of the main magnetic source, extending the magnetic field beyond the opening in the hollow cathode and adding a stationary or mobile magnetic field source adjacent to the closed end surface of the hollow cathode target. The present invention employs various embodiments which when implemented individually or in combination improve the full face erosion of a target cathode in a hollow cathode magnetron sputtering source.

16 Claims, 16 Drawing Sheets

U.S. PATENT DOCUMENTS

| | | | |
|---|---|---|---|
| 4,416,759 | 11/1983 | Harra et al. | 204/298.11 |
| 4,422,916 | 12/1983 | McKelvey | 204/192.12 |
| 4,428,816 | 1/1984 | Class et al. | 204/298.18 |
| 4,434,037 | 2/1984 | Crank | 204/192.12 |
| 4,436,602 | 3/1984 | Harra et al. | 204/192.25 |
| 4,443,318 | 4/1984 | McKelvey | 204/298.23 |
| 4,457,825 | 7/1984 | Lamont, Jr. | 204/298.12 |
| 4,491,509 | 1/1985 | Krause | 204/192.12 |
| 4,564,435 | 1/1986 | Wickersham | 204/298.12 |
| 4,569,746 | 2/1986 | Hutchinson | 204/298.09 |
| 4,588,490 | 5/1986 | Cuomo et al. | 204/298.06 |
| 4,595,482 | 6/1986 | Mintz | 204/298.03 |
| 4,604,180 | 8/1986 | Hirukawa et al. | 204/298.18 |
| 4,606,806 | 8/1986 | Helmer | 204/298.12 |
| 4,622,121 | 11/1986 | Wegmann et al. | 204/298.18 |
| 4,627,904 | 12/1986 | Mintz | 204/298.06 |
| 4,657,654 | 4/1987 | Mintz | 204/298.12 |
| 4,661,228 | 4/1987 | Mintz | 204/192.25 |
| 4,721,553 | 1/1988 | Saito et al. | 204/192.12 |
| 4,734,183 | 3/1988 | Wirz et al. | 204/298.2 |
| 4,747,926 | 5/1988 | Shimizu et al. | 204/298.12 |
| 4,774,437 | 9/1988 | Helmer et al. | 315/111.81 |
| 4,858,556 | 8/1989 | Siebert | 118/664 |
| 4,865,712 | 9/1989 | Mintz | 204/298.16 |
| 4,871,433 | 10/1989 | Wagner et al. | 204/192.12 |
| 4,904,362 | 2/1990 | Gaertner et al. | 204/192.12 |
| 4,915,805 | 4/1990 | Rust | 204/192.12 |
| 4,939,041 | 7/1990 | Kabacoff et al. | 428/607 |
| 4,957,605 | 9/1990 | Hurwitt et al. | 204/192.12 |
| 4,966,677 | 10/1990 | Aichert et al. | 204/298.21 |
| 5,045,166 | 9/1991 | Bobbio | 204/192.32 |
| 5,073,245 | 12/1991 | Hedgcoth | 204/298.21 |
| 5,126,028 | 6/1992 | Hurwitt et al. | 204/192.13 |
| 5,174,875 | 12/1992 | Hurwitt et al. | 204/192.12 |
| 5,178,739 | 1/1993 | Barnes et al. | 204/192.12 |
| 5,178,743 | 1/1993 | Kumar | 204/298.21 |
| 5,180,478 | 1/1993 | Hughes | 204/298.09 |
| 5,228,963 | 7/1993 | Rose | 204/192.12 |
| 5,229,358 | 7/1993 | Kumar | 505/1 |
| 5,252,194 | * 10/1993 | Demaray et al. | 204/298.2 |
| 5,277,779 | * 1/1994 | Henshaw | 204/192.12 |
| 5,317,006 | 5/1994 | Kumar | 204/298.12 |
| 5,333,726 | 8/1994 | Makowiecki et al. | 204/298.09 |
| 5,334,302 | 8/1994 | Kubo et al. | 204/298.18 |
| 5,346,600 | 9/1994 | Nieh et al. | 204/192.3 |
| 5,437,778 | 8/1995 | Hedgcoth | 204/298.21 |
| 5,457,298 | 10/1995 | Nelson et al. | 219/121.52 |
| 5,482,611 | 1/1996 | Helmer et al. | 204/298.17 |
| 5,529,674 | 6/1996 | Hegcoth | 204/298.21 |
| 5,685,961 | 11/1997 | Pourrezai et al. | 204/192.15 |

OTHER PUBLICATIONS

Gruzdev, et al., "Intitiation of Discharge With A Cold Hollow Cathode By a Gas Magnetron", Oct. 1980 Sov. Phys. Tech. Phys., vol. 25, No. 10.

Ihsan, et al. "Effect of Deposition Parameters on Properties Of Films Deposited On Fibers By Hollow Cathode Magnetron Sputtering", May/Jun. 1990 J. Vac. Sci. Technol. vol. 8, No. 3.

Ja'fer, et al., "A Low–Voltage, High–Current, Ion–Bombardment Source Using Mangetron Principles", 1993, Vacuum, vol. 44, No. 3/4.

Kawasaki, et al., "High Speed Pipe Inner Coating using Magnetron Hollow–Cathode Discharge In A Magnetic Field", 1991, Materials Science and Engineering, A140, pp. 682–686.

Kovarik, et al., "Initiation of Hot Cathode Arc Discharges By Electron Confinement In Penning and Magnetron Configurations", Jun. 1982, Rev. Sci. Instrum. 53.

V. Miljevic, "Hollow–Cathode Magnetron Ion Source", Jan. 1984, Rev. Sci. Instrum., vol. 55, No. 1.

Schiller, et al., "Advances In High Rate Sputtering With Magnetron–Plasmatron Processing And Instrumentation", 1979, Thin Solid Films, pp. 455–467.

Thornton, John A., "Magnetron Sputtering: Basic Physics and Application To Cylindrical Magnetrons", Mar./Apr. 1978, J. Vac. Sci. Technol. vol. 15, No. 2.

Varian, "Full Spectrum Sputtering".

Wickersham, Jr., "Target Operating Temperatures In Conical Magnetron Type Sputtering Sources", 1989, Tosoh SMD, Inc.

Window, et al., "Magnetron Sputtering Sources for Ferromagnetic Material", Jan./Feb. 1985, J. Vac. Sci. Technol., vol. A3, No. 1.

Yeom et al., "Cylindrical Magnetron Discharges. I. Current–Voltage Characteristics For DC–And RF–Driven Discharge Sources", May 15, 1989, J. Appl. Phys. vol.65, No. 10.

Yeom, et al., "Cylindrical Magnetron Discharges. II. The Formation of DC Bias In RF–Driven Discharge Sources", May 15, 1989, J. Appl. Phys. vol .65, No. 10.

* cited by examiner

APPARATUS AND METHOD FOR IMPROVING TARGET EROSION IN HOLLOW CATHODE MAGNETRON SPUTTER SOURCE

BACKGROUND OF THE INVENTION

1. Field of the Invention

The present invention relates to the field of thin film deposition. More specifically, the present invention relates to improving uniform target erosion in a physical vapor deposition (PVD) hollow cathode magnetron sputter source.

2. The Background

The deposition of thin film layers is a common processing step in the fabrication of very large scale integrated (VLSI) circuits and ultra large scale integrated (ULSI) circuits on semiconductor substrates or wafers. A semiconductor wafer is the foundation from which is built a large quantity of discrete devices, commonly known in the art as integrated circuit chips. Metallic thin film layers are typically employed as device interconnects which are deposited on to a wafer by known physical or chemical vapor deposition techniques. In addition, it is also frequently required that small holes; referred to in the art as vias, or narrow grooves; referred to as trenches, be properly filled with metallization in order to provide electrical connection between device layers.

Recent innovations and cost constraints within the semiconductor industry have hastened the need to improve techniques used to dispose thin films on substrates. By example, wafer size has increased from 6-inch (150 mm) diameter to 8-inch (200 mm) diameter with a growing acceptance of even larger 12-inch (300 mm) diameter wafers. As wafer size increases, the ability to impart requisite directionality to thin films becomes increasingly difficult. Many current preferred methods of forming thin films, such as PVD sputtering, are only able to meet directionality and uniformity requirements by inducing a trade-off of slower processing rates. In today's highly competitive commercial semiconductor market improvements that carry with them increases in processing time are not viable economical alternatives. Similarly, the heightened complexity of current discrete devices have increased wafer densities and have led to vias and trenches with higher aspect ratios (depth of the via versus the width of the via) and smaller geometries. As the geometries of such vias and trenches decrease, it becomes increasingly more difficult to conformally deposit material throughout the entire depth of vias or grooves. Therefore, the need exists within the semiconductor industry to continue to strive for an adaptable, highly efficient means for thin film deposition.

Conventional PVD sputtering allows for the deposition of relatively pure thin films on substrates of various types and geometries. Standard sputtering is accomplished by creating at a relatively low pressure of a plasma forming gas a plasma comprising, typically, an inert gas, such as argon (Ar), in the vicinity of a target cathode which is made of the material to be deposited. Positively charged plasma atoms, known as ions, then strike the cathode target causing atoms of the target cathode to be ejected into the plasma. These target atoms then travel through the sputtering vacuum and are deposited onto the semiconductor substrate. Conventional diode PVD sputtering has shown to be both inefficient and, in some instances, incapable of providing required directionality to thin films when constructing VLSI and ULSI circuits. The plasma that is created with a standard PVD sputtering device lacks a sufficient amount of ionized target material atoms. The degree of ionization of a plasma is referred to in the art as the plasma intensity. The more intense the plasma, the greater the ability to steer and focus the plasma and, thus, impart an adequate amount of directionality to the ions in the plasma. By improving the ion directionality, it insures that the thin films being deposited have adequate coverage in vias and trenches. In addition, when the intensity of the plasma makes it more conducive to focusing operations overall processing times typically decrease and target material utilization is optimized.

As a means for overcoming the limitations of conventional PVD sputtering, use magnetic fields in magnetron sputtering devices have successfully been introduced into the process. These magnetron sputtering systems have seen wide-spread use in semiconductor manufacturing for the deposition of metallization layers, such as aluminum (Al), titanium (Ti), titanium nitride (TiN) and titanium tungsten (TiW) alloys. As with standard sputtering devices, the magnetron sputtering apparatus consists of a vacuum chamber which confines an inert support gas, commonly argon (Ar), at a relatively low pressure, typically 3–5 millitorr. An electrical field (E) is then created within the vacuum chamber by introducing a negative potential across the target cathode and creating an anode, typically, by means of grounding the overall sputter chamber or a using a self-biased floating anode. A magnetic field (B) is introduced into the vacuum chamber, typically in an orientation such that the field lines loop through the cathode for the purpose of creating and confining a plasma near the target cathode. As positive ions from the plasma strike the target cathode, atoms are ejected from the surface of the cathode. The magnetic field serves to attract an electron-rich portion of the plasma in the vicinity of the cathode. In addition, electrons trapped about the cathode allow for an increase in the collisions between the neutral atoms ejected from the surface of the target and the rapidly moving electrons. By increasing the quantity of collisions, the likelihood increases that a neutral ejected target atom will be struck by a sufficiently energetic particle within the plasma, thus causing the ejected target atom to lose one or more electrons and result in an ionized atom. By increasing the quantity of ionized target atoms within the plasma the overall effect is the increase in the plasma density, i.e., the number of particles in a given confined area. This increase in plasma density is also known in the art as an increase in the intensity of the plasma. As the plasma intensity increases so does the probability that further ionization of ejected target atoms will occur.

Magnetron sputtering devices have shown a wide variance of success in being able to deposit thin films efficiently and with the requisite step coverage and uniformity. A high percentage of such devices are limited in their ionization efficiency due in part to the fact that the vast majority of metal atoms ejected from the target remain neutral and the cathode configuration of such devices only result in a small volume of the plasma being retained in front of the target surface. Even with the use of magnetic fields to trap plasmas about the target cathode, the intensity of the plasma remains insufficient and, in certain embodiments, upwards of 98% or greater of the deposition material atoms remain un-ionized as they travel through the sputter chamber to the substrate. The general understanding is that atoms are ejected from the surface of the sputter target at random angles and that the mean-free path of travel between the target cathode and the substrate for these neutral metal atoms is reduced by random collisions with other target atoms or inert gas ions. When the predominately neutral atoms in these plasmas do come in contact with the substrate they characteristically do so over a wide range of angles, generally conforming to a cosine distribution. In particular, when atoms are disposed on substrate surfaces at angles less than normal it poses significant difficulty in uniformly filling trenches and interconnect vias. The emphasis on adequate step coverage of thin films is exasperated by the demands of the semiconductor industry. As the overall semiconductor geometries have shrunk and the chip densities have increased, so too have the demands on being able to impart required directionality to thin films in narrower and deeper vias and/or trenches.

The teachings found in U.S. Pat. No. 5,482,611 (the '611 or Helmer patent) entitled "Physical Vapor Deposition Employing Ion Extraction from a Plasma" have shown to be highly effective in providing a physical vapor deposition source which imparts an improved degree of ion directionality while achieving a commercially acceptable high deposition rate.

As shown in FIG. 1 the unique hollow cathode configuration of the magnetron disclosed in the '611 patent allows for a magnetic null 10 to exist on the radial axis 12 of the hollow cathode 14 a small distance from the cathode opening. This magnetic null 10 acts as a "cusp mirror" that reflects back into the hollow cathode cavity 16 most of the electrons susceptible to prematurely escaping from the plasma. The reflective nature of the cusp mirror allows for further electron interaction with ejected target material atoms and, thereby, increases the probability that target atom ionization will occur. In confining the plasma within the hollow cathode cavity 16 for a lengthened period of time, the '611 patent is successful in creating a high density plasma within the hollow region of the cathode. While most plasma densities prior to the inception of the '611 patent are of a maximum order of $10^{12}$ particles per cubic centimeter (particles/cc), this cathode configuration is able to achieve a much higher density plasma on the order of $10^{13}$ particles/cc or what amounts to an approximately 10 times increase in plasma density.

FIG. 2 depicts a cross sectional view of the discharge plasma and the plasma beam within the '611 hollow cathode magnetron sputtering system. Once the electrons in the discharge plasma leave the hollow cathode cavity 20, the cusp mirror 22 at the magnetic null region 24 isolates the electrons in the plasma beam 26 from the electrons in the hollow cathode cavity 20. The result is that the plasma beam 26 formed in the '611 patent is much more flexible than a standard plasma and can be manipulated and focused without affecting the discharge characteristics within the hollow cathode cavity 20. The cusp mirror 22 also embodies a loss-cone (not shown) which serves as the means whereby a plasma beam 26 is developed and emitted towards the substrate 28. The depiction of the loss cone region is purposely omitted from FIG. 3 because the loss cone concept is more closely related to the radial velocity along the z-axis as opposed to a spatial relationship within the cusp mirror. As previously discussed most electrons are reflected back into the hollow cathode cavity 20, however, a small percentage escape through the loss-cone towards the substrate 28. To maintain a neutral charge balance, ions are pulled along with the electrons by ambipolar diffusion creating the plasma beam 26. In order for electrons to escape through the loss-cone region of the cusp mirror 22, the magnetic moment of the escaped electrons must be smaller than the mirror ratio of the cusp mirror 22. As a result of this phenomena, the transverse velocity of the plasma beam 26 is greatly reduced. By limiting the beam velocity, the plasma beam 26 becomes much more conducive to steering, focusing or expanding the plasma beam 26 via the use of magnetic fields or electric fields.

The high level of plasma intensity that the '611 patent results in, is required to achieve the degree of ionization efficiency necessary to impart improved directionality and step coverage to the thin film and increase throughput to the overall deposition process. As shown in FIG. 3, when the substrate 30 is allowed to "float" electrically and a negative charge imparted from the plasma beam 32 is built up thereupon, target ions in the plasma beam 32, being positively charged, are attracted toward the surface of the substrate. As the plasma beam 32 approaches the substrate 30 it tends to hover above the surface of the substrate 30 by means of a thin low-voltage plasma sheath 34 which is created between the substrate 30 and the plasma beam 32. The potential gradient across this plasma sheath 34 is normal to the surface of the substrate 30 and, thus, taking into account the velocities and energies imparted to the ions, when the ions reach the substrate after being accelerated through the sheath, the angle of incidence approaches normal. When the plasma beam 32 is intense enough so that it contains an ample degree of ionized target atoms, directionality can be imparted to the plasma and ultimately to the thin film being deposited. The directionality problems exhibited when neutral target atoms predominate in the deposited film are diminished and proper step coverage of deep vias and narrow grooves can be realized.

In operation this configuration of a hollow cathode magnetron has shown to be highly effective in efficiently processing thin films with requisite step coverage, however; the overall efficiency of such a sputtering apparatus has been greatly impaired by non-uniform target erosion. When target erosion is limited to less than full-face erosion, the useful life of the target cathode is diminished and the likelihood of target particulate matter contaminating the deposited thin film becomes a concern. Shorter target life results in increased apparatus downtime associated with having to change targets frequently, and increases operating costs due to inefficient target utilization. Particulate matter, which flakes off from unevenly eroded targets, is especially a concern with target materials such as TiN and TiW.

FIG. 4 details the typical erosion profile that results during normal use of a prior art hollow cathode magnetron 40. In this instance, when the magnetic field is relatively uniform in strength between north magnetic poles 42 and south magnetic poles 44, the erosion groove 46 tends to have an asymmetric profile and forms around the cylindrical wall 48 near the cathode opening 50. FIG. 5 illustrates the rationale behind this erosion profile. An axial electric field exists in the hollow cathode 52 due in part to the incomplete shielding by the initially formed plasma, creating what is depicted here as constant electrical potential lines (E) 54. As the magnetic field lines (B) 56 become parallel to the constant electric potential lines (E) 54 near the interior cylindrical wall 58 of the hollow cathode 52 and close to the opening in the hollow cathode 52, the E×B, or magnetron action, would be at maximum strength. As a result, the erosion profile tends to center at this location 60 and its penetration into the target cathode is greatest at this locale. When such an erosion profile results, only approximately 30% of the target life is utilized prior to the target needing replacement.

BRIEF DESCRIPTION OF THE INVENTION

Magnetic field lines within a hollow cathode magnetron sputtering device are modified by various means to improve the full-face erosion profile of the hollow cathode target.

These means include: varying the magnetic field of the main magnetic source, extending the magnetic field beyond the opening in the hollow cathode and adding a stationary or mobile magnetic field source adjacent to the closed end surface of the hollow cathode target. The present invention employs various embodiments which when implemented individually or in combination improve the full face erosion of a target cathode in a hollow cathode magnetron sputtering source.

A stationary magnetic field source positioned adjacent to the closed end of the hollow cathode target serves to draw the magnetic field away from the wall of the target and aids in creating uniform magnetic field strength throughout the hollow region of the target. A mobile magnetic field source positioned adjacent to the closed end of the hollow cathode target serves the same purpose as the stationary magnetic field source and, in addition, serves to disperse the magnetic field as required by the desired erosion profile. Varying the magnetic field of the main magnetic source aids in producing magnetic fields which better align with the electrical fields to create equivalent magnetron action throughout the hollow region of the target. Extending the magnetic field beyond the wall of the hollow cathode insures that erosion will take place at the wall surface near the hollow cathode target opening.

OBJECTS AND ADVANTAGES OF THE INVENTION

Accordingly, it is an object of the present invention to provide a means within the hollow cathode magnetron for matching the magnetic field lines (B) to closely track the electric potential lines (E) around the wall and closed end surface of the hollow cathode to achieve full face erosion of the target.

It is a further advantage of the present invention to increase the useful life of a target cathode thereby decreasing unnecessary operating costs associated with premature target replacement.

It is a further advantage of the present invention to limit the need to frequently replace target cathodes within a hollow cathode magnetron device thereby avoiding unwarranted machine downtime and increasing overall processing throughput.

It is a further advantage of the present invention to decrease the probability of target particulate matter entering into the sputtering process and posing the threat of contaminating the thin film layering process.

These and many other objects and advantages of the present invention will become apparent to those of ordinary skill in the art from a consideration of the drawings and ensuing description.

DETAILED DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

The present invention employs various embodiments which when implemented individually or in combination improve the full face erosion of a target cathode in a high-intensity plasma hollow cathode magnetron sputtering source. Those of ordinary skill in the art will realize that the following description of the present invention is illustrative only and not in any way limiting. Other embodiments of the invention will readily suggest themselves to such persons skilled in the art.

Figure 6:
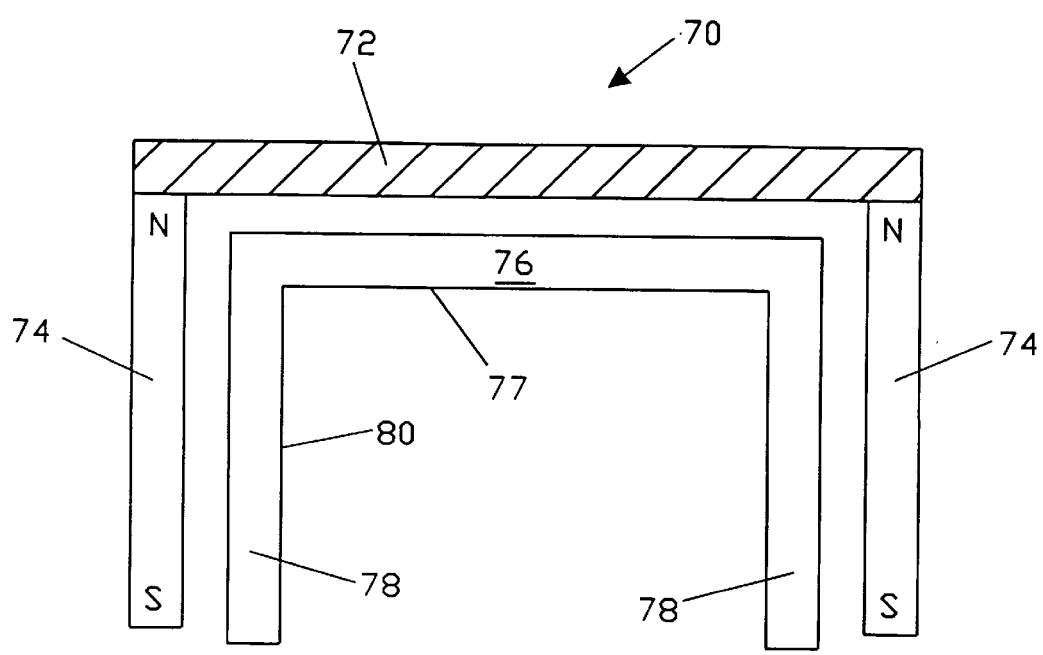
FIG. 6 is a cross-sectional diagram of a hollow cathode magnetron incorporating the use of a pole plate in accordance with a presently preferred embodiment of the present invention.

FIG. 6 is a cross-sectional view of a hollow cathode magnetron 70 highlighting the first embodiment of the present invention. In this embodiment a solid circular pole plate 72, is positioned adjacent to both the end of the toroidal or ring shaped permanent magnet 74 near the closed end 76 of the hollow cathode 78 and the exterior surface of the closed end 76 of the hollow cathode 78. The pole plate 72 may be constructed from iron or other suitable soft magnetic materials which are capable of attracting a magnetic field.

Figure 1:
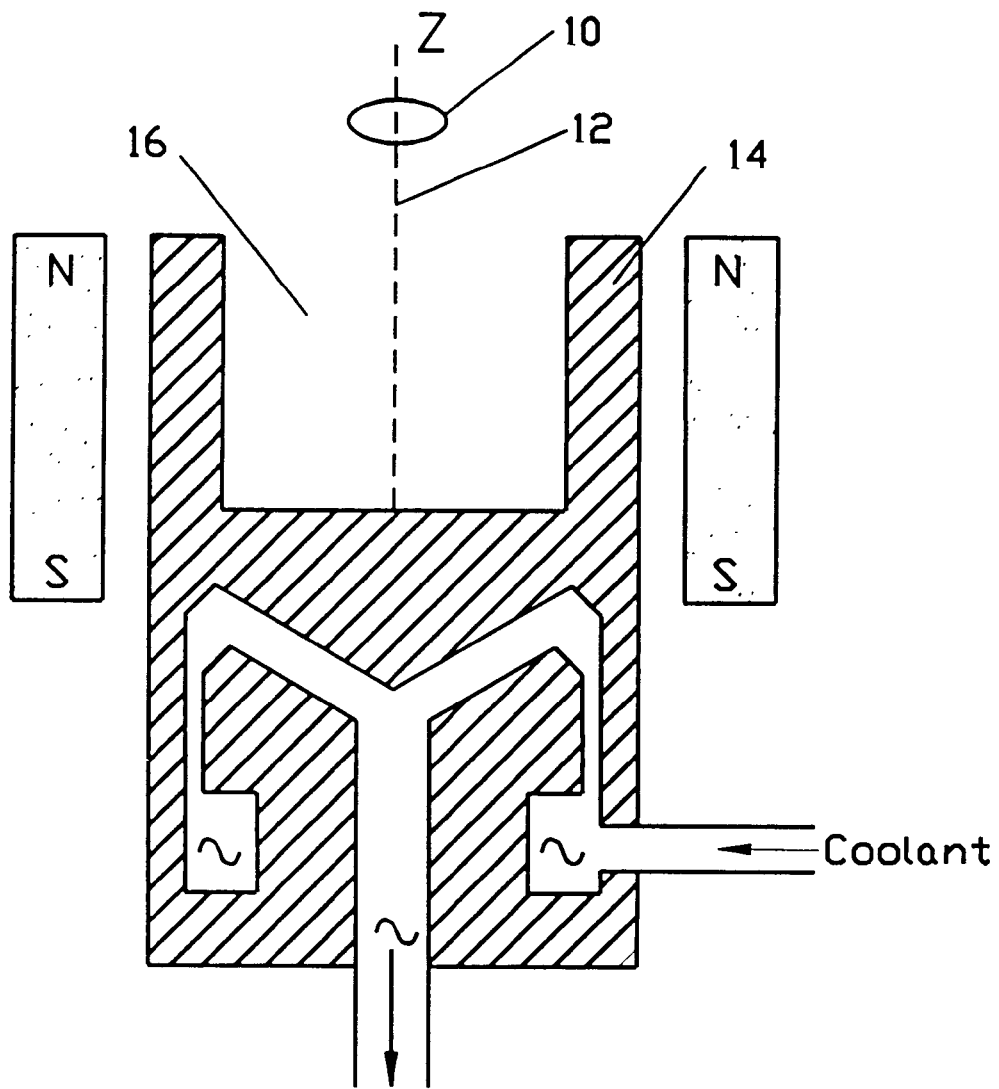
FIG. 1 is a cross-sectional diagram of a hollow cathode magnetron in accordance with the prior art.
Figure 2:
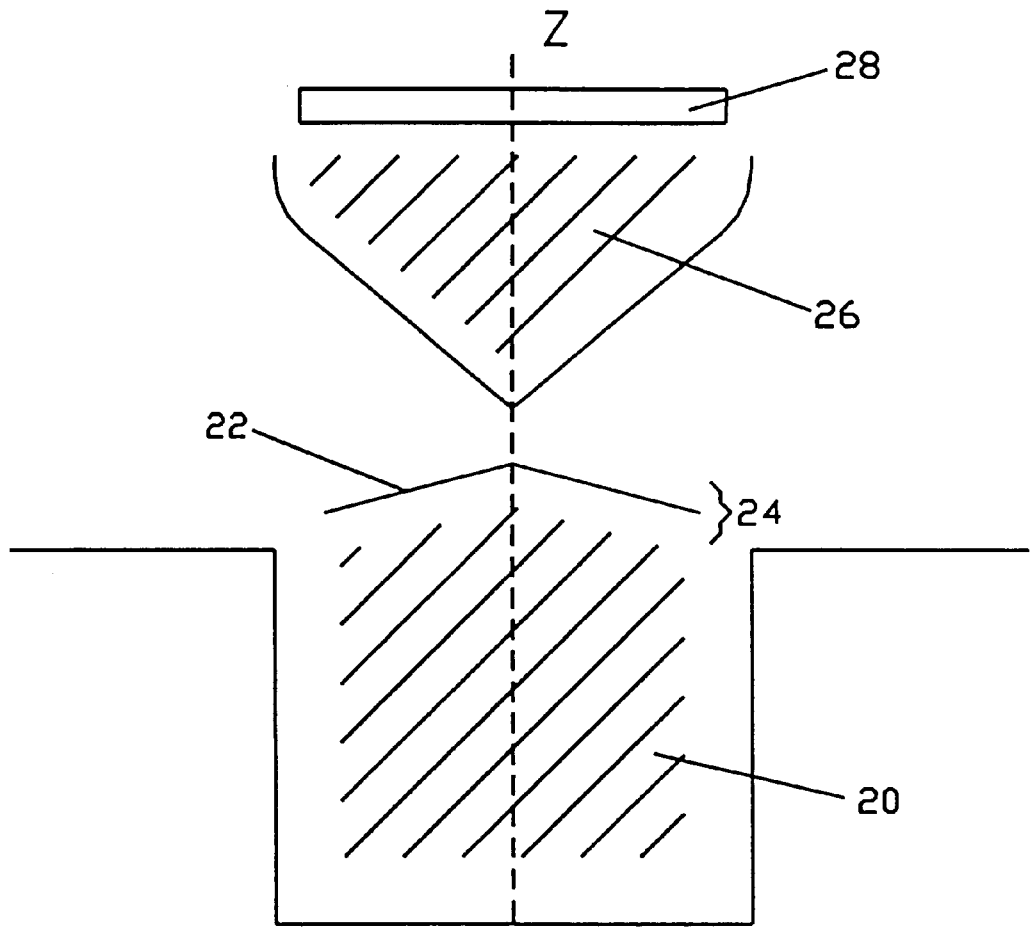
FIG. 2 is a cross sectional diagram of a plasma in a hollow cathode magnetron being extracted through the cusp mirror at the magnetic null region in accordance with the prior art.
Figure 3:
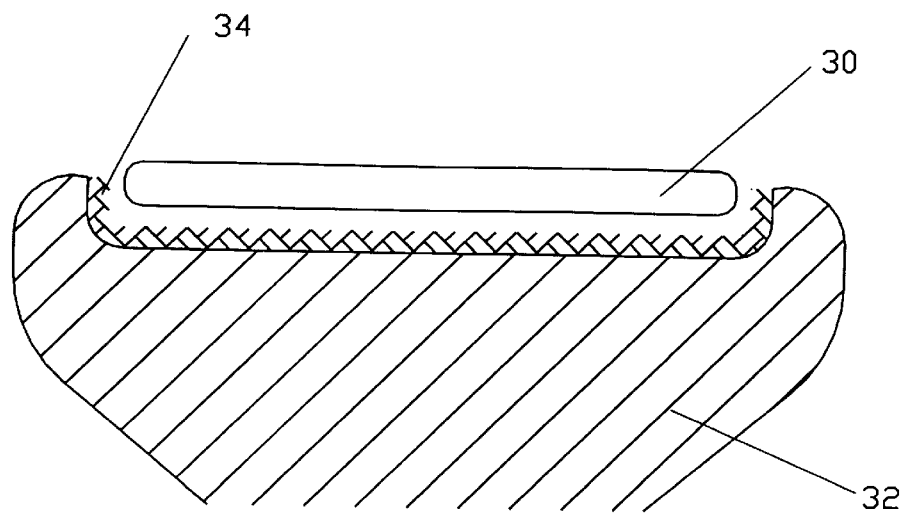
FIG. 3 is a cross sectional diagram of the plasma as it comes in contact with the substrate requiring thin film coverage in accordance with the prior art.
Figure 4:
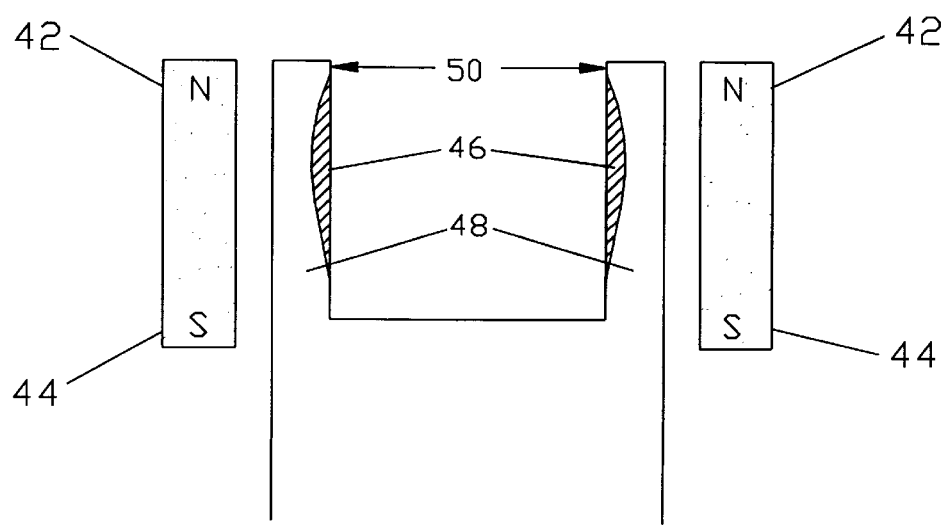
FIG. 4 is a cross-sectional diagram of the target erosion profiles in accordance with prior art hollow cathode magnetrons.
Figure 5:
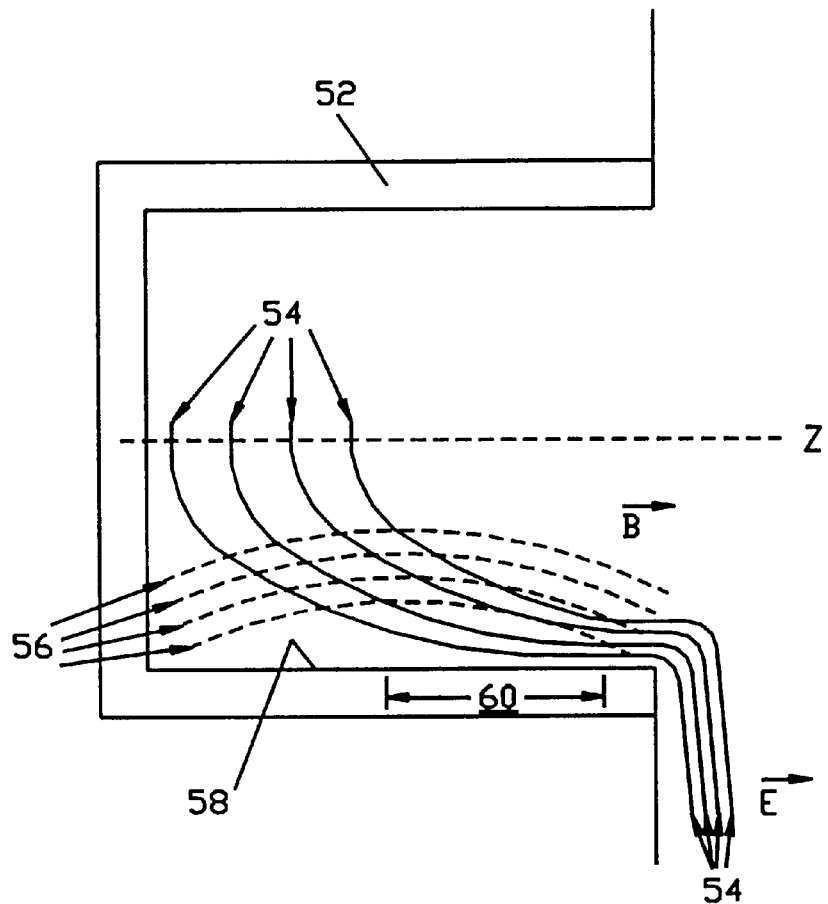
FIG. 5 is a cross-sectional diagram of the electrical and magnetic field lines present in the cavity of a hollow cathode magnetron in accordance with the prior art.

The solid pole plate 72 serves to direct the looping magnetic fields of prior art hollow cathode magnetron sources (see FIG. 5) away from the interior cylindrical wall 80 of the hollow cathode 78 and allows for the magnetic field lines to move in a more perpendicular direction toward the closed end 76 of the hollow cathode 78. While the prior art hollow cathode magnetron creates an acute looping magnetic field adjacent to the interior cylindrical wall 80, use of a pole plate 72 serves to direct the magnetic field perpendicular to the closed end 76 of the hollow cathode 78 and more parallel to the interior cylindrical wall 80 of the hollow cathode 78; thus, lessening the overall looping effect of the field. In concentrating the magnetic field towards the closed end 76 of the hollow cathode 78, the pole plate 72 decreases the strong magnetron action (E×B) concentrated along the cylindrical wall 80 near the open end of the hollow cathode 78 and creates a more uniform magnetron action throughout the hollow cathode 78; resulting in a more uniform erosion profile along the cylindrical wall 80 of the hollow cathode 78. It will be noted that while use of a pole plate increases target utilization from 30% to upwards of 50% by creating full face erosion about the hollow cathode cylindrical wall 80, the pole plate 72, by itself, has limited effect on the erosion profile of the closed end surface 77 of the hollow cathode 78.

In a second embodiment of the present invention the magnetic field created by the toroidal or ring shaped magnets is altered by either adding spacers between a stack of independent equal strength ring magnets, stacking independent ring shaped magnets of variable strength or using one independent tapered field magnet.

Figure 7:
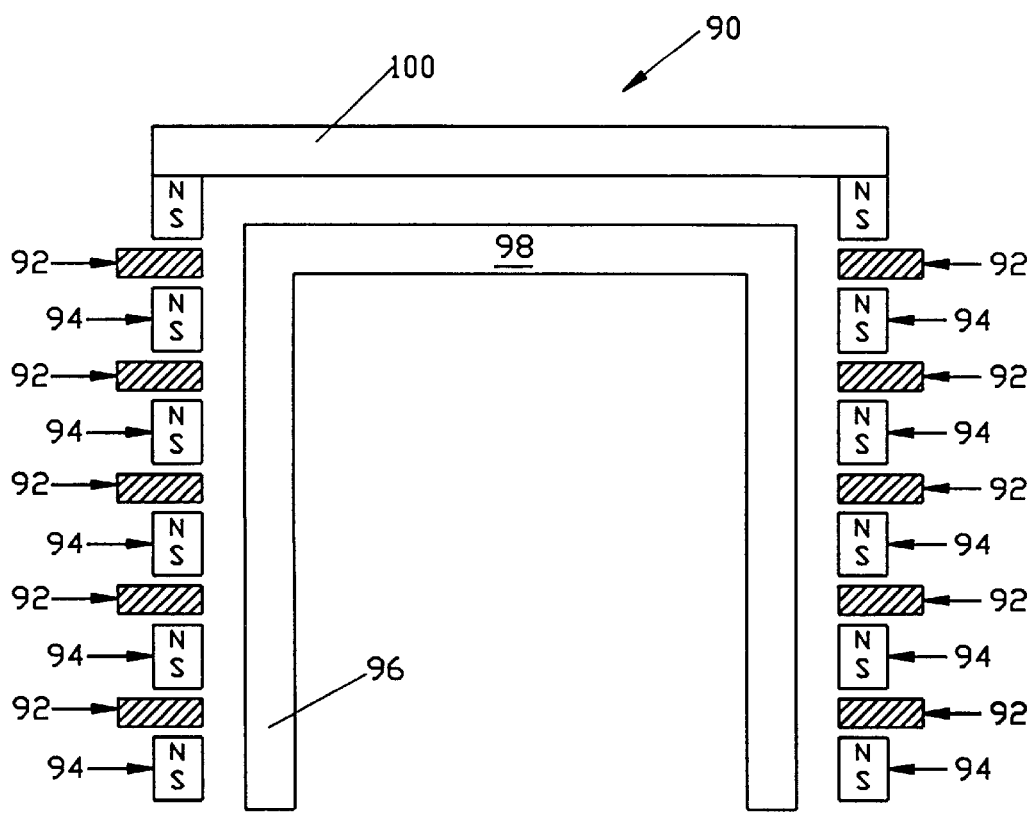
FIG. 7 is a cross-sectional diagram of a hollow cathode magnetron incorporating the use of spacers between equal strength magnetic field sources in accordance with another alternative preferred embodiment of the present invention.

FIG. 7 is a cross-sectional view of a hollow cathode magnetron 90 using spacers 92 between identical strength magnets 94. Here, the thickness of the spacers 92 vary for the purpose of creating a flared magnetic field in the hollow region of the cathode; the largest thickness spacer 92 is placed nearest the opening in the hollow cathode 96 with the thickness of the spacers decreasing proportionally as they approach the magnet 92 nearest the closed end 98 of the hollow cathode 96. Adjacent to closed end 98 of the hollow cathode 96 is a solid pole plate 100 in accordance with the first embodiment of this invention. Use of the pole plate 100, in conjunction with the stacked and spaced magnet configuration further benefits uniform target erosion.

Figure 8:
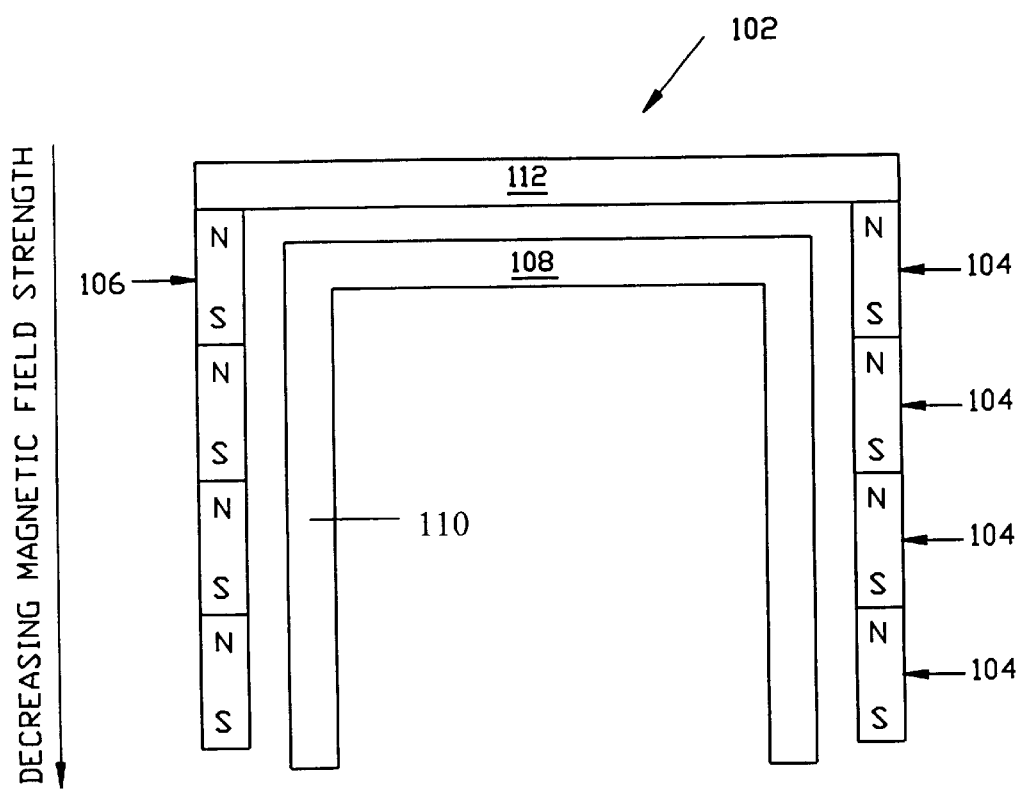
FIG. 8 is a cross-sectional diagram of a hollow cathode magnetron incorporating the use of variable strength magnetic field sources in accordance with another alternative preferred embodiment of the present invention.

FIG. 8 is a cross-sectional view of a hollow cathode magnetron 102 using variable strength magnets 104. In this depiction, the strongest field magnet 106 is placed at the top of the stack nearest the closed end 108 of the hollow cathode 110 and magnets of proportionally lesser strength are stacked below the top magnet 106 to create the overall effect of a varying magnetic field. Adjacent to closed end 108 of the hollow cathode 110 is a solid pole plate 112 in accordance with the first embodiment of this invention. Use of the pole plate 112, in conjunction with the stacked variable strength magnet configuration further benefits uniform target erosion.

Figure 9:
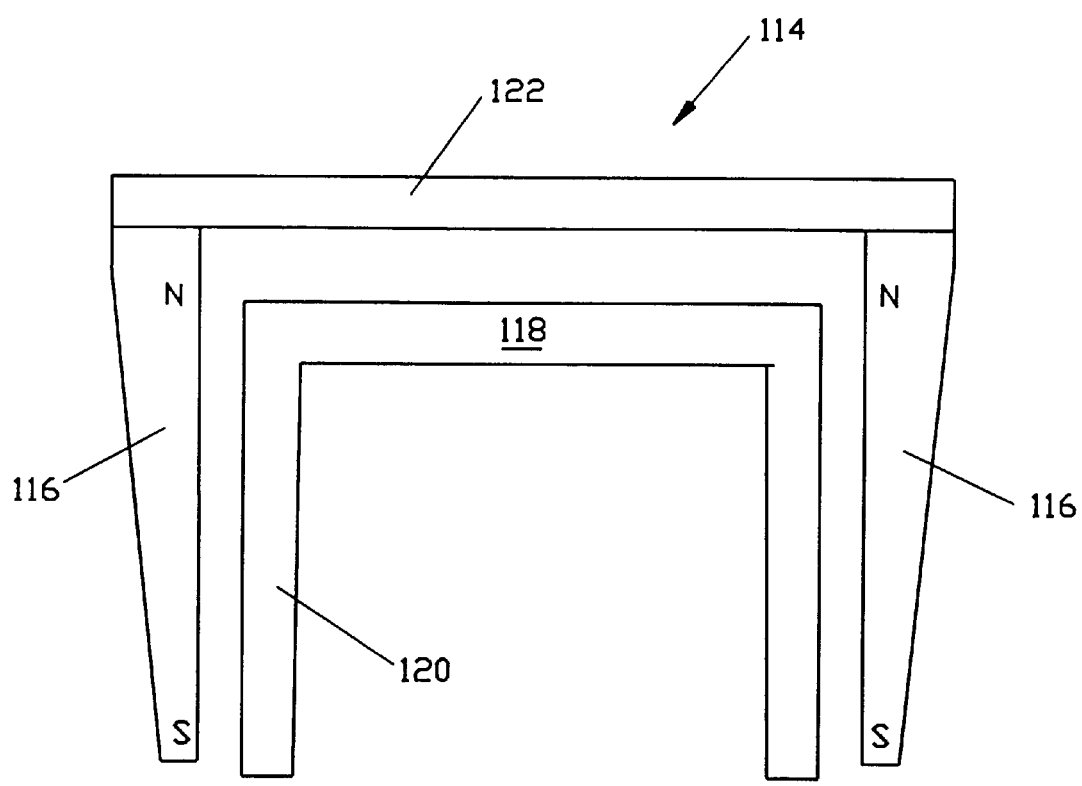
FIG. 9 is a cross-sectional diagram of a hollow cathode magnetron incorporating the use of a tapered magnetic field source in accordance with another alternative preferred embodiment of the present invention.

FIG. 9 is a cross-sectional view of a hollow cathode magnetron 114 using a tapered field magnet 116. In this configuration the tapered field magnet 116 is built from material having a uniform magnetic field; however, more magnetic material is situated at the north end of the tapered field magnet 116 creating a stronger magnetic field at the north pole. In this illustration, the magnetic field nearest the closed end 118 of the hollow cathode 120 is proportionally greater than the magnetic field nearest the opening of the hollow cathode 120. Adjacent to closed end 118 of the hollow cathode 120 is a solid pole plate 122 in accordance with the first embodiment of this invention. Use of the pole plate 122, in conjunction with the tapered field magnet further benefits uniform target erosion.

These alternatives create a flaring magnetic field which increases monotonically from the top of the hollow cathode opening to the closed end of the hollow cathode. Use of such magnets vary the strength of the magnetic field exhibited along the z-axis of the hollow cathode. The purpose of varying the magnetic field is to create magnetic field lines that closely track the electrical potential contours which exist around the cylindrical wall of the hollow cathode. When magnetic and electrical fields approach a parallel relationship throughout the hollowed region, full face erosion along the cathode cylindrical wall can be realized. In much the same fashion as the previously described pole plate embodiment, use of flaring magnetic fields in conjunction with a cup-like hollow cathode configuration will serve to increase target utilization from 30% to approximately 50% by developing full face erosion about the cylindrical wall. Use of variable strength magnetic fields in conjunction with a pole plate can serve to increase target utilization beyond 50%.

Figure 10:
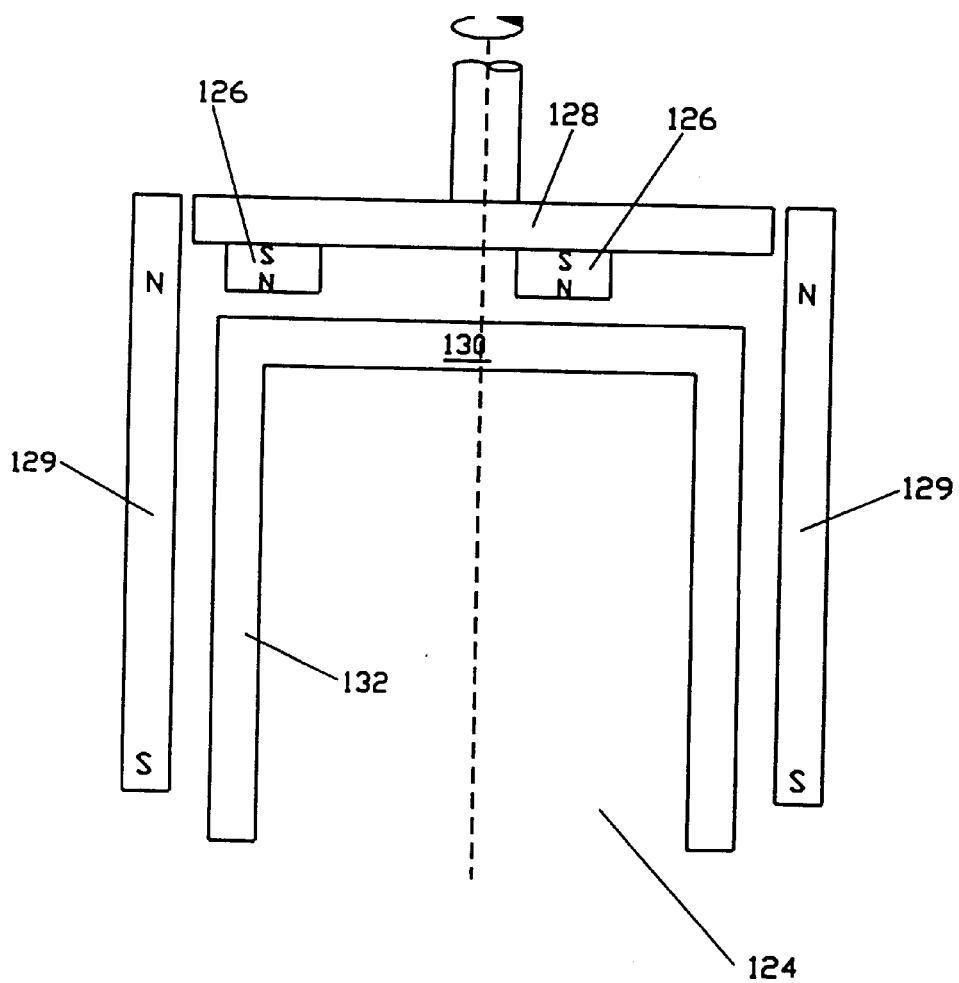
FIG. 10 is a cross-sectional diagram of a hollow cathode magnetron incorporating the use of a rotating ring magnet positioned above the target in accordance with another alternative preferred embodiment of the present invention.

In a third embodiment of the present invention, a magnet which rotates is positioned atop the closed end of the hollow cathode. FIG. 10 depicts a cross-sectional view of a hollow cathode magnetron 124 utilizing a rotating magnet 126. In this illustration the magnet 126 is ring shaped and is secured to a rotating plate 128. The rotating plate is typically formed from either a non-magnetic material or a soft-magnetic material and rotates at a typical speed of 60–120 rpm. The magnet 126 which typically has reversed polarity with respect to the main magnet 129 aids in providing a better match between the magnetic field lines and electrical potential contours and, thus, the magnetic field gradient at the closed end 130 of the hollow cathode 132 is greatly increased. By increasing the magnetic field gradient at closed end 130 of the hollow cathode 132 two distinct benefits are gained; first, redeposition of previously ejected target atoms on the closed end 130 of the hollow cathode 132 is minimized and; secondly, full face erosion of the closed end 130 surface of the hollow cathode 132 can be achieved.

Figure 11A:
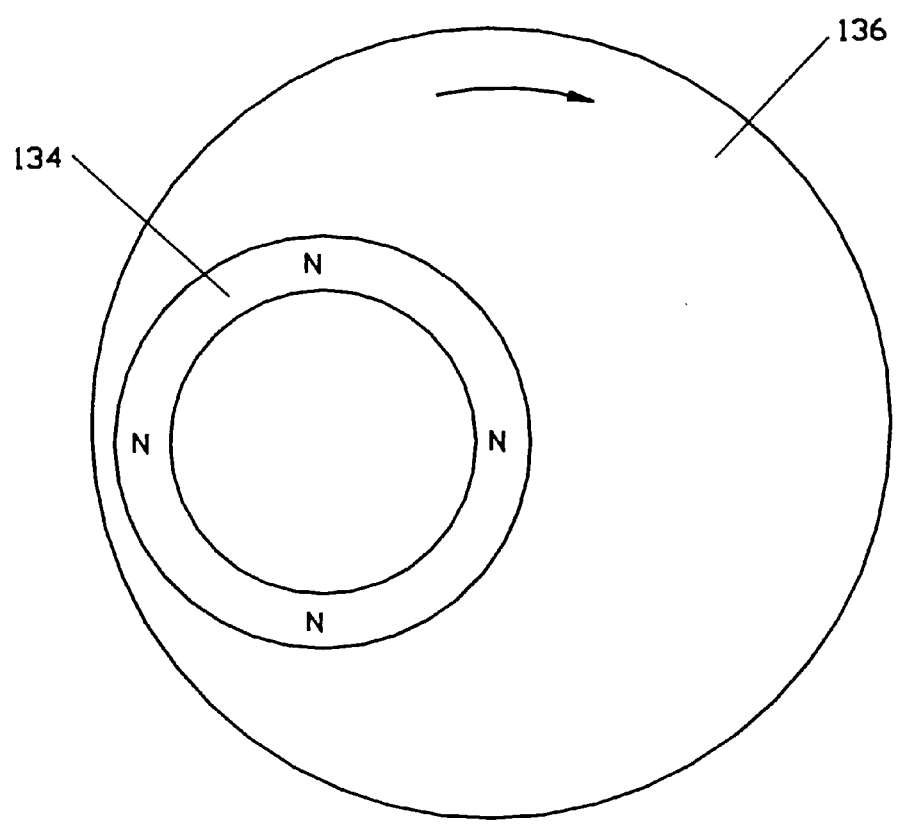
FIG. 11A is a bottom-view diagram of a ring magnet positioned off-center atop a rotating base plate in accordance with another alternative preferred embodiment of the present invention.
Figure 11B:
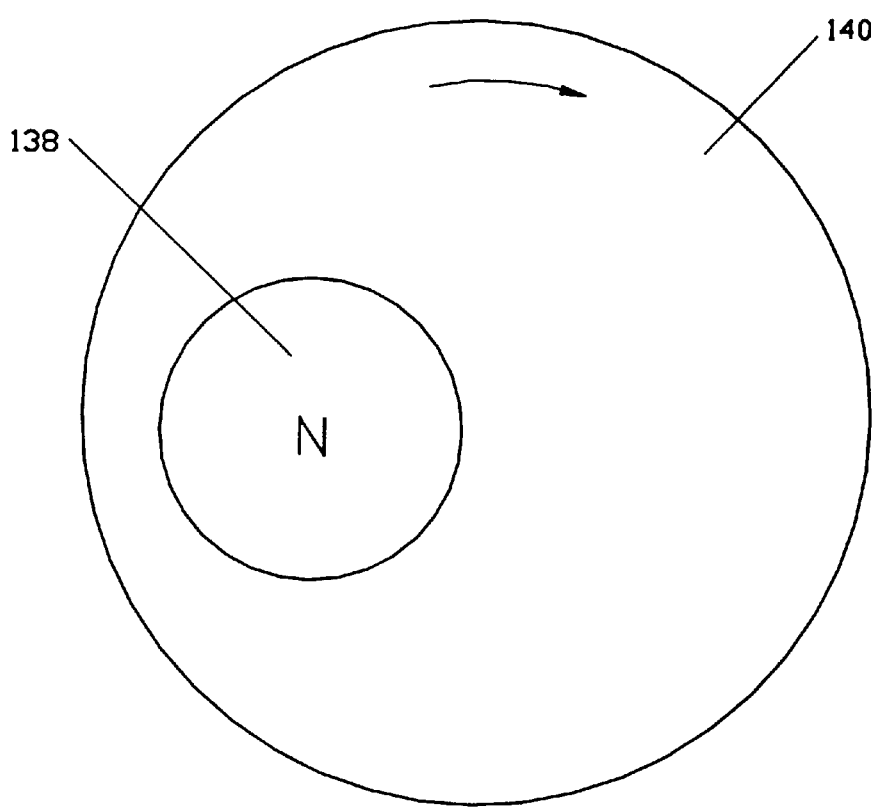
FIG. 11B is a bottom-view diagram of a disc shaped magnet positioned off-center atop a rotating base plate in accordance with another preferred embodiment of the present invention.
Figure 11C:
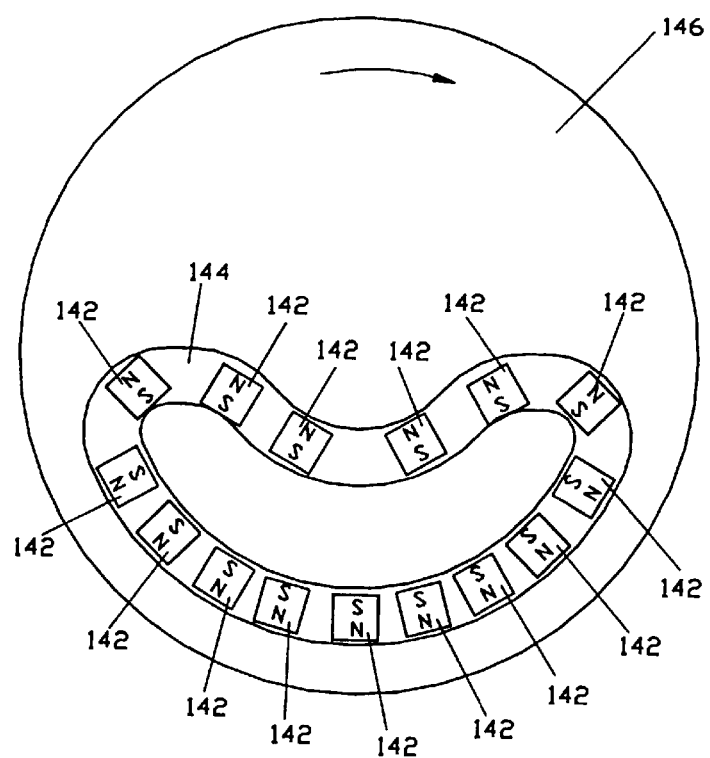
FIG. 11C is a bottom-view diagram of a heart-shaped magnet holding structure position and its corresponding magnets positioned atop a rotating base plate in accordance with another preferred embodiment of the present invention.

FIGS. 11A, 11B and 11C illustrate various possible configurations for the rotating magnet. By altering the shape of the magnet, the rotation pattern, or, the polar direction of the magnet, it is possible to maximize the full-face erosion of the cathode. Shown in FIG. 11A is the bottom view of the rotating magnet shown in the FIG. 10 cross-sectional view. A ring magnet 134 is positioned on the rotating plate 136 with the north pole of the magnet adjacent to the closed end 130 surface of the hollow cathode. This configuration allows for the ring magnet 134 to be positioned off-center in relation to the rotating plate 136. The rotating plate 136 revolves around its z-axis (or vertical) resulting in an off-center circular rotation pattern for the ring magnet 134. In another configuration, FIG. 11B, a disc shaped magnet 138 is positioned off-axis in relation to the rotating plate 140 and rotated around the symmetrical z-axis of the rotating plate 140. In FIG. 11C, individual bar magnets 142 have been placed in a heart-shaped holding structure 144 which is positioned on the rotating plate 146. This type of holding structure 144 allows for magnets be to added, removed or repositioned to achieve the desired erosion profile. As shown in FIG. 11C, the magnets have been positioned so that the polarity is shifted 90 degrees in comparison to the polarity observed in the FIGS. 11A and 11B ring magnet configurations.

Figure 12:
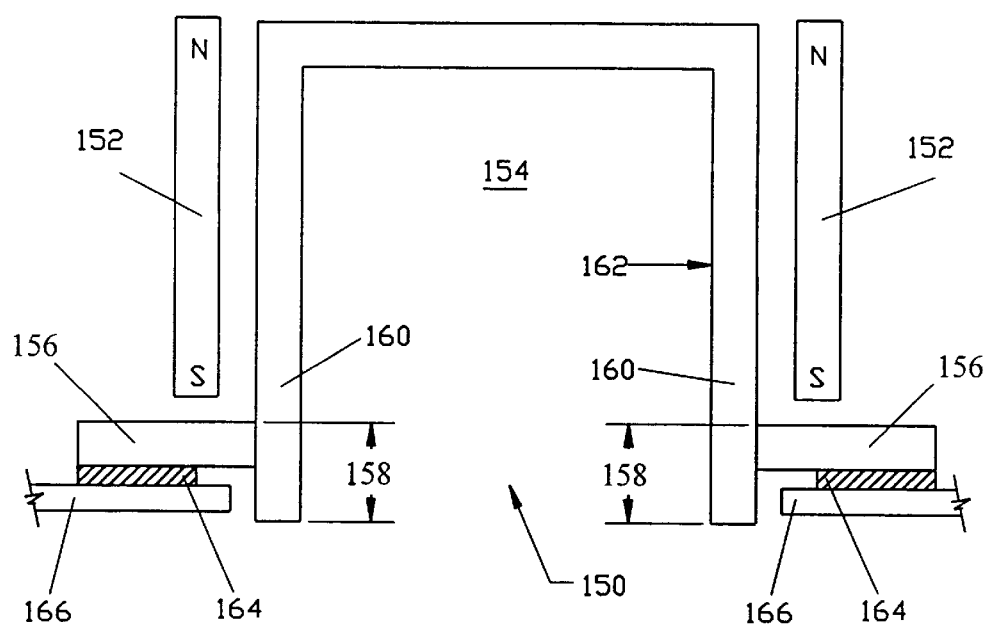
FIG. 12 is a cross-sectional diagram of a hollow cathode magnetron highlighting the recessed magnetic field source in accordance with the prior art.

In a fourth embodiment of the present invention an extender magnet or extender pole is added above the main magnet extending beyond the opening of the hollow region of the cathode. FIG. 12 depicts a prior art hollow cathode magnetron 150 configured without the benefit of an extender magnet. To avoid heating and outgassing of the magnetic materials the main magnet 152 is positioned outside of the vacuum cavity region 154. The vacuum flange 156 serves to isolate the magnet 152 from the vacuum cavity 154. However, in positioning the vacuum flange 156 as depicted, the main magnet 152 must be recessed a distance 158 from the open end of the hollow cathode 160. As a result of the recess distance 158, the magnetic field strength at the open end of the hollow cathode 160 is minimal and results in an absence of an erosion profile along the cylindrical wall 162 nearest the open end of the hollow cathode 160. While the lack of erosion at the open end of the hollow cathode 160 culminates in poor overall target utilization, it also poses the potential for particulate problems in the disposed thin film if a build-up of redeposed target atoms occurs in the vicinity of the open end of the hollow cathode 160. Alleviating this problem by minimizing the recess distance 158 through design optimization would be arduous as the vacuum flange 156 needs to withstand atmospheric pressures and the insulator 164 needs to withstand excessive voltages between the anode 166 and hollow cathode 160.

Figure 13:
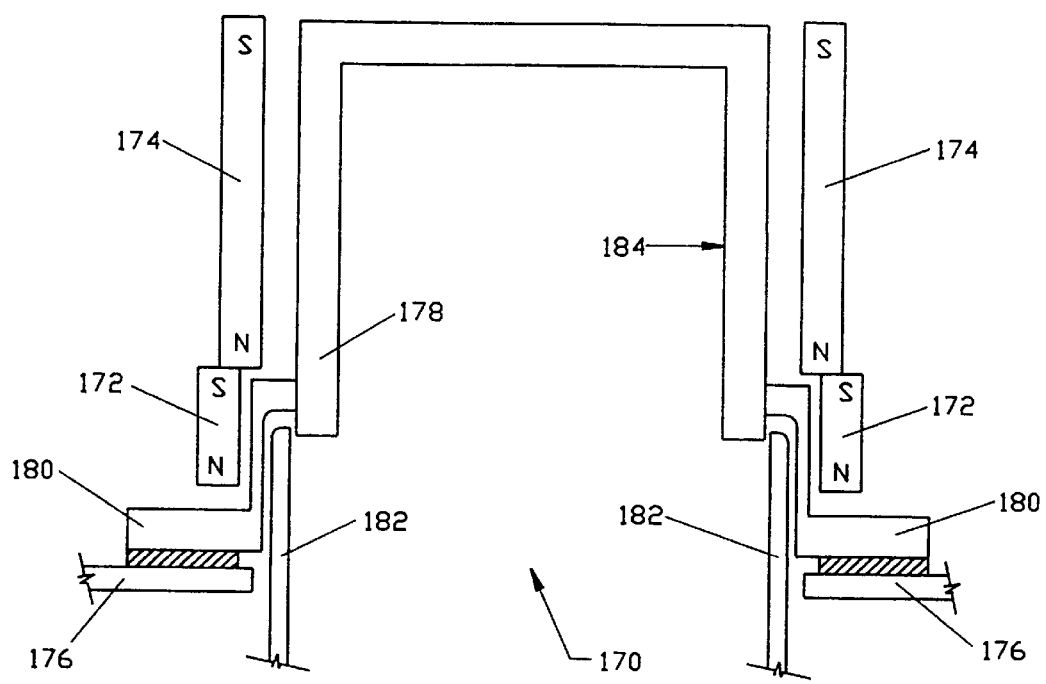
FIG. 13 is a cross-sectional diagram of a hollow cathode magnetron incorporating the use of an extender magnetic field source in accordance with an alternate preferred embodiment of the present invention.

FIG. 13 illustrates a hollow cathode magnetron 170 which embodies the use of an extender magnet 172. The extender magnet 172 is ring shaped, slightly larger in diameter than the main magnet 174 so that when the extender magnet 172 is placed atop the main magnet 174, it is slightly offset from the main magnet 174 to account for the proper placement of the anode 176. The extender magnet 172 is oriented in the same polar direction as the main magnet 174. Alternatively, the extender magnet 172 may be a soft-magnetic pole plate serving the same purpose of extending the magnetic field beyond the open end of the hollow cathode 178. As is depicted in FIG. 13, this embodiment of the present invention requires that the vacuum flange 180 be moved a distance away from the opening in the hollow cathode 178 and an additional curved shaped anode shield 182 be used to facilitate shielding. By positioning the extender magnet 172 so that it extends beyond the opening of the hollow cathode 178, the magnetic field of the magnetron is extended and, thus, a symmetrical full-face erosion profile can be achieved about the cylindrical wall 184 near the open end of the hollow cathode 178 by allowing the magnetic field lines to enter into the hollow region through the opening in the hollow cathode 178 as opposed to through the cathode cylindrical wall 184.

Figure 14:
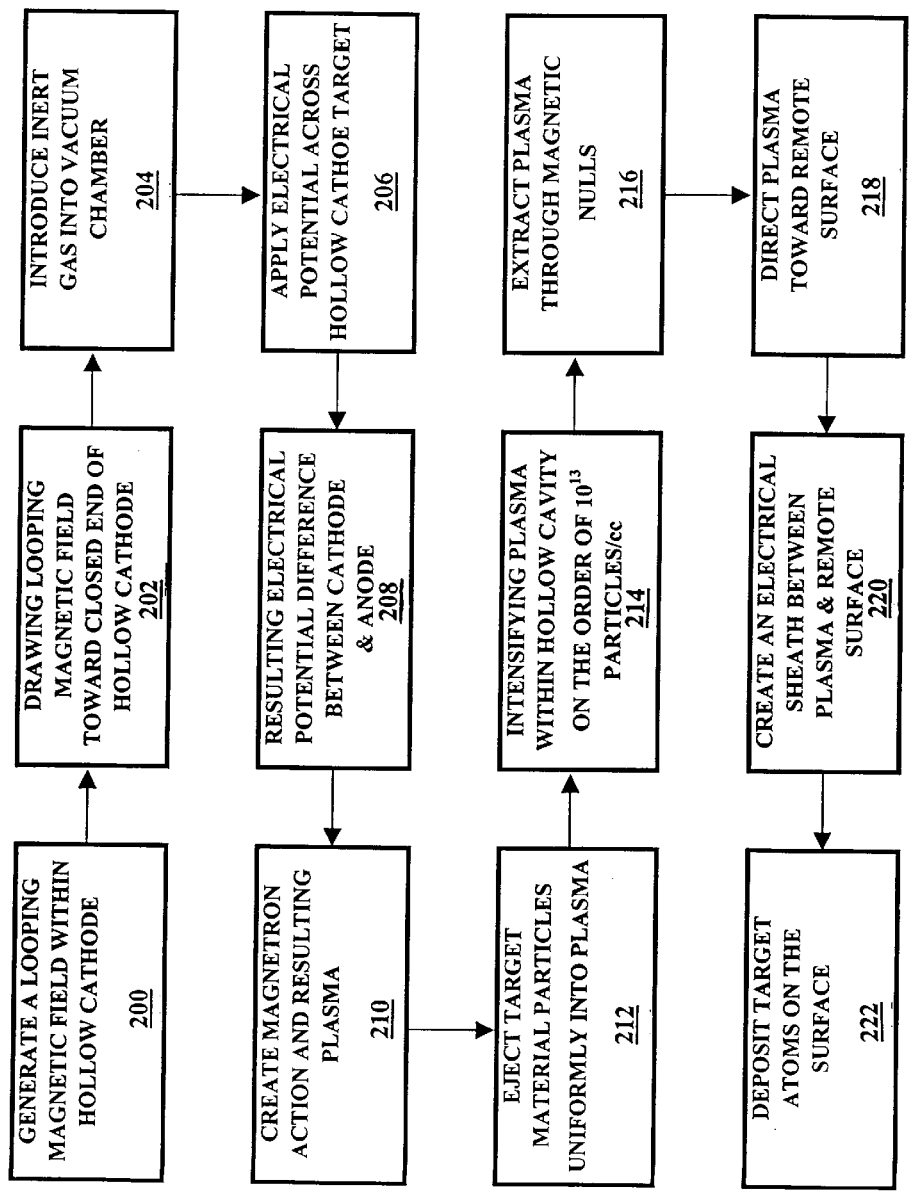
FIG. 14 is a flowchart illustrating a presently preferred method of carrying out the present invention.

The described invention is also represented as a method for hollow cathode magnetron sputtering. FIG. 14 diagrams the flow of the method for hollow cathode magnetron sputtering embodied within this invention. At block 200 a magnetic field is generated within the sputtering apparatus and produces magnetic field lines which loop through the opening in the hollow cathode target and provide for a magnetic null region adjacent to the open side in the hollow cathode target. The magnetic field which is generated may be of varying strength or may be extended beyond the opening in the hollow cathode target. At block 202 the looping magnetic field is drawn toward the closed end surface of the hollow cathode target via the use of a pole plate or rotating magnet positioned adjacent to the exterior of the closed end surface of the hollow cathode target. At block 204 a gas, typically an inert gas such as argon, is introduced into the vacuum chamber of the sputtering apparatus and is held at relatively low pressure, typically 3–5 millitorr.

The method proceeds at block 206 where an electrical potential is applied across the hollow cathode target. Once the electrical potential is applied, at block 208 an electrical potential difference results between the hollow cathode target and an anode. At block 210 the magnetic field and the electrical field interact and create the requisite magnetron action which generates a plasma within the hollow region of the hollow cathode target.

At block 212 target material particles are uniformly ejected from all interior surfaces of the hollow cathode target. At block 214 continuing magnetron action results in the plasma being ionized to an intensity on the order of $10^{13}$ particles/cc. At block 216 the sufficiently intense plasma is extracted through the magnetic null region of the hollow cathode sputtering source. At block 218 the ion intensive plasma beam is directed toward a surface requiring thin film coverage. At block 220 an electrical sheath potential is created between the plasma and the surface requiring thin film coverage. Finally, at block 222 the sheath allows particles to be pulled from the plasma and deposited on the remote surface requiring thin film coverage.

Figure 15:
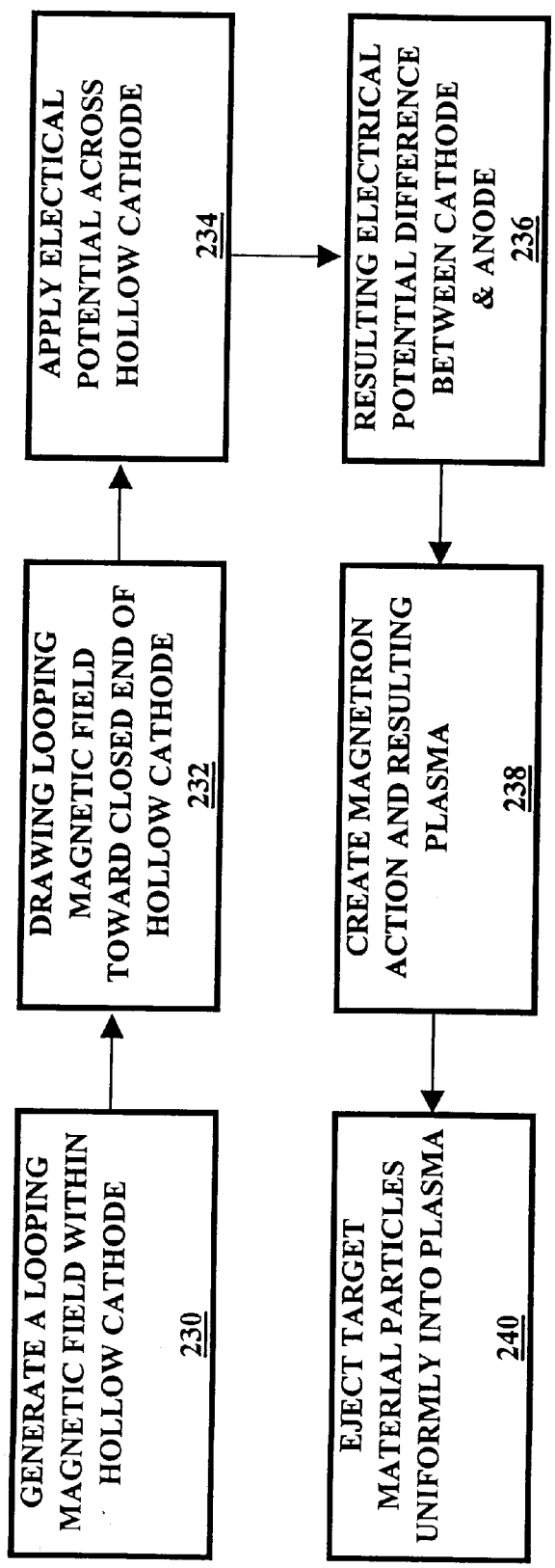
FIG. 15 is a flowchart illustrating a method for a uniform erosion of the hollow cathode target of the present invention.

In addition, the invention is also represented in a method for uniform erosion of the hollow cathode target as shown in the flowchart of FIG. 15. At block 230 a magnetic field is generated within the sputtering apparatus and produces magnetic field lines which loop through the opening in the hollow cathode target and provide for a magnetic null region adjacent to the open side in the hollow cathode target. The magnetic field which is generated may be of varying strength or may be extended beyond the opening in the hollow cathode target. At block 232 the looping magnetic field is drawn toward the closed end surface of the hollow cathode target via the use of a pole plate or rotating magnet positioned adjacent to the exterior of the closed end surface of the hollow cathode target. At block 234 an electrical potential is applied across the hollow cathode target. Once the electrical potential is applied, at block 236 an electrical potential difference results between the hollow cathode target and an anode. At block 238 the magnetic field and the electrical field interact and create the requisite magnetron action which generates a plasma within the hollow region of the hollow cathode target. At block 240 target material particles are uniformly ejected from all interior surfaces of the hollow cathode target.

Alternate Embodiments

Although illustrative presently preferred embodiments and applications of this invention are shown and described herein, many variations and modifications are possible which remain within the concept, scope and spirit of the invention, and these variations would become clear to those skilled in the art after perusal of this application. The invention, therefore, is not limited except in spirit of the appended claims.

What is claimed is:

1. A hollow cathode magnetron sputtering source comprising:

a vacuum chamber having an inlet for introducing a plasma-forming gas into said vacuum chamber;

a hollow cathode target disposed within said vacuum chamber, said hollow cathode target comprising a particle confining container having a wall disposed about a vertical axis of said hollow cathode target, a closed end surface and an open side;

an anode;

an electrical potential source coupled to said hollow cathode target;

a plasma forming region disposed in said vacuum chamber between said closed end surface of said hollow cathode target and said anode;

a magnetic field source, said magnetic field source emanating from a region surrounding exterior of said wall, said magnetic field source comprises a stack of variable strength magnets decreasing in magnetic field strength monotonically from a magnet closest to said closed end surface of said hollow cathode target to a magnet closest to said open side of said hollow cathode target; and a pole plate, said pole plate positioned adjacent to said closed end surface of said hollow cathode target.

2. A hollow cathode magnetron sputtering source comprising:

a vacuum chamber having an inlet for introducing a plasma-forming gas into said vacuum chamber;

a hollow cathode target disposed within said vacuum chamber, said hollow cathode target comprising a particle confining container having a wall disposed about a vertical axis of said hollow cathode target, a closed end surface and an open side;

an anode;

an electrical potential source coupled to said hollow cathode target;

a plasma forming region disposed in said vacuum chamber between said closed end surface of said hollow cathode target and said anode;

a magnetic field source, said magnetic field source emanating from a region surrounding exterior of said wall, said magnetic field source comprises a stack of magnets, said stack of magnets being separated by variable thickness spacers, said spacers increasing in thickness monotonically from a spacer closest to said closed end surface of said hollow cathode target to a spacer closest to said open side of said hollow cathode target; and a pole plate, said pole plate positioned adjacent to said closed end surface of said hollow cathode target.

3. A hollow cathode magnetron sputtering source comprising:

a vacuum chamber having an inlet for introducing a plasma-forming gas into said vacuum chamber;

a hollow cathode target disposed within said vacuum chamber, said hollow cathode target comprising a particle confining container having a wall disposed about a vertical axis of said hollow cathode target, a closed end surface and an open side;

an anode;

an electrical potential source coupled to said hollow cathode target;

a plasma forming region disposed in said vacuum chamber between said closed end surface of said hollow cathode target and said anode;

a magnetic field source, said magnetic field source emanating from a region surrounding exterior of said wall, said magnetic field source further comprises a tapered field magnet, said tapered field magnet having maximum magnetic field strength closest to said closed end surface of said hollow cathode target and monotonically decreasing magnetic field strength approaching said open side of said hollow cathode target; and a pole plate, said pole plate positioned adjacent to said closed end surface of said hollow cathode target.

4. A hollow cathode magnetron sputtering source comprising:

a vacuum chamber having an inlet for introducing a plasma-forming gas into said vacuum chamber;

a hollow cathode target disposed within said vacuum chamber, said hollow cathode target comprising a particle confining container having a wall disposed about a vertical axis of said hollow cathode target, a closed end surface and an open side;

an anode;

an electrical potential source coupled to said hollow cathode target;

a plasma forming region disposed in said vacuum chamber between said closed end surface of said hollow cathode target and said anode;

a magnetic field source, said magnetic field source emanating from a region surrounding exterior of said wall, said magnetic field source comprises a stack of variable strength magnets decreasing in magnetic field strength monotonically from a magnet closest to said closed end surface of said hollow cathode target to a magnet closest to said open side of said hollow cathode target; and a rotating magnet positioned adjacent to said closed end surface of said hollow cathode target.

5. A hollow cathode magnetron sputtering source comprising:

a vacuum chamber having an inlet for introducing a plasma-forming gas into said vacuum chamber;

a hollow cathode target disposed within said vacuum chamber, said hollow cathode target comprising a particle confining container having a wall disposed about a vertical axis of said hollow cathode target, a closed end surface and an open side;

an anode;

an electrical potential source coupled to said hollow cathode target;

a plasma forming region disposed in said vacuum chamber between said closed end surface of said hollow cathode target and said anode;

a magnetic field source, said magnetic field source emanating from a region surrounding exterior of said wall, said magnetic field source comprises a stack of magnets, said stack of magnets being separated by variable thickness spacers, said spacers increasing in thickness monotonically from a spacer closest to said closed end surface of said hollow cathode target to a spacer closest to said open side of said hollow cathode target; and a rotating magnet positioned adjacent to said closed end surface of said hollow cathode target.

6. A hollow cathode magnetron sputtering source comprising:

a vacuum chamber having an inlet for introducing a plasma-forming gas into said vacuum chamber;

a hollow cathode target disposed within said vacuum chamber, said hollow cathode target comprising a particle confining container having a wall disposed about a vertical axis of said hollow cathode target, a closed end surface and an open side;

an anode;

an electrical-potential source coupled to said hollow cathode target;

a plasma forming region disposed in said vacuum chamber between said closed end surface of said hollow cathode target and said anode;

a magnetic field source, said magnetic field source emanating from a region surrounding exterior of said wall, said magnetic field source further comprises a tapered field magnet, said tapered field magnet having maximum magnetic field strength closest to said closed end surface of said hollow cathode target and monotonically decreasing magnetic field strength approaching said open side of said hollow cathode target; and a rotating magnet positioned adjacent to said closed end surface of said hollow cathode target.

7. A hollow cathode magnetron sputtering source comprising:

a means for creating a plasma, said plasma consisting of an inert gas held at low pressure;

a hollow cathode target, said hollow cathode target comprising a particle confining container having an open end, a wall, and a closed end surface, said hollow cathode target confining said plasma within a hollow region, said hollow cathode target comprising a selected target material;

a means to apply a voltage across said hollow cathode target, said voltage creating an electrical field within said hollow region of said hollow cathode target;

a means for generating a magnetic field, said magnetic field emanating from an area surrounding exterior of said wall of said hollow cathode target, said magnetic field creating a magnetic null region adjacent to said open end of said hollow cathode target, said magnetic field having looping magnetic field lines which intersect said wall of said hollow cathode target, said means for generating a magnetic field comprises stacking variable strength magnets about the exterior of said wall of said hollow cathode target to alter profile of the magnetic field within said hollow region of said hollow cathode target, said variable strength magnets decreasing in magnetic field strength monotonically from a magnet closest to said closed end surface of said hollow cathode target to a magnet closest to said open side of said hollow cathode target;

a means for altering direction of said looping magnetic field lines, said means for altering the direction resulting in increased uniformity of erosion throughout the surface area of said hollow cathode target;

a means for intensifying said plasma on the order of at least about $10^{13}$ particles/cc, said plasma containing a percent of ions of said selected target material greater than 2.0 percent;

a means for extracting ions from said plasma through said magnetic null region;

a means for focusing the path of extracted ions toward a remote surface to be deposited on; and a means for creating an electrical sheath potential between said plasma and said remote surface to be deposited on, said electrical sheath potential allowing for said target material particles to contact said surface to be deposited on at near normal angles of incident.

8. A hollow cathode magnetron sputtering source comprising:

a means for creating a plasma, said plasma consisting of an inert gas held at low pressure;

a hollow cathode target, said hollow cathode target comprising a particle confining container having an open end, a wall, and a closed end surface, said hollow cathode target confining said plasma within a hollow region, said hollow cathode target comprising a selected target material;

a means to apply a voltage across said hollow cathode target, said voltage creating an electrical field within said hollow region of said hollow cathode target;

a means for generating a magnetic field, said magnetic field emanating from an area surrounding exterior of said wall of said hollow cathode target, said magnetic field creating a magnetic null region adjacent to said open end of said hollow cathode target, said magnetic field having looping magnetic field lines which intersect said wall of said hollow cathode target, said means for generating a magnetic field comprises stacking, alternately, equal strength magnets and spacers of varying thickness about the exterior of said wall of said hollow cathode target to alter profile of the magnetic field within a confining region of said hollow cathode target, said spacers increasing in thickness monotonically from a spacer closest to said closed end surface of said hollow cathode target to a spacer closest to said open side of said hollow cathode target;

a means for altering direction of said looping magnetic field lines, said means for altering the direction resulting in increased uniformity of erosion throughout the surface area of said hollow cathode target;

a means for intensifying said plasma on the order of at least about $10^{13}$ particles/cc, said plasma containing a percent of ions of said selected target material greater than 2.0 percent;

a means for extracting ions from said plasma through said magnetic null region;

a means for focusing the path of extracted ions toward a remote surface to be deposited on; and a means for creating an electrical sheath potential between said plasma and said remote surface to be deposited on; said electrical sheath potential allowing for said target material particles to contact said surface to be de-posited on at near normal angles of incident.

9. A hollow cathode magnetron sputtering source comprising:

a means for creating a plasma, said plasma consisting of an inert gas held at low pressure;

a hollow cathode target, said hollow cathode target comprising a particle confining container having an open end, a wall, and a closed end surface, said hollow cathode target confining said plasma within a hollow region, said hollow cathode target comprising a selected target material;

a means to apply a voltage across said hollow cathode target, said voltage creating an electrical field within said hollow region of said hollow cathode target;

a means for generating a magnetic field, said magnetic field emanating from an area surrounding exterior of said wall of said hollow cathode target, said magnetic field creating a magnetic null region adjacent to said open end of said hollow cathode target, said magnetic field having looping magnetic field lines which intersect said wall of said hollow cathode target, said means for generating a magnetic field comprises the use of a tapered field magnet positioned about the exterior of said wall of said hollow cathode target to alter profile of the magnetic field within the confining region of said hollow cathode target, said tapered field magnet having maximum magnetic field strength closest to said closed end surface of said hollow cathode target and monotonically decreasing magnetic field strength approaching said open side of said hollow cathode target;

a means for altering direction of said looping magnetic field lines, said means for altering the direction resulting in increased uniformity of erosion throughout the surface area of said hollow cathode target;

a means for intensifying said plasma on the order of at least about $10^{13}$ particles/cc, said plasma containing a percent of ions of said selected target material greater than 2.0 percent;

a means for extracting ions from said plasma through said magnetic null region;

a means for focusing the path of extracted ions toward a remote surface to be deposited on; and a means for creating an electrical sheath potential between said plasma and said remote surface to be deposited on; said electrical sheath potential allowing for said target material particles to contact said surface to be deposited on at near normal angles of incident.

10. A method for physical vapor deposition of a thin film comprising:

producing a magnetic field, said magnetic field looping through an opening in a hollow cathode target, said magnetic field resulting in a magnetic null region adjacent to said opening in said hollow cathode target, said producing a magnetic field step comprises stacking variable strength magnets about an exterior wall of said hollow cathode target to alter profile of the magnetic field within a confining region of said hollow cathode target, said variable strength magnets decreasing in magnetic field strength monotonically from a magnet closest to said closed end surface of said hollow cathode target to a magnet closest to said open side of said hollow cathode target;

drawing said magnetic field toward a closed end surface of said hollow cathode target by using a pole plate to draw and direct said magnetic field toward the closed end surface of said hollow cathode target;

introducing a plasma forming gas into a vacuum chamber and holding said plasma forming gas at low pressure;

applying an electrical potential across said hollow cathode target;

creating an electrical potential difference between said hollow cathode target and an anode resulting in an electrical field;

interacting said magnetic field and said electrical field to create magnetron action which generates a plasma within a [the] hollow region of said hollow cathode target;

ejecting target material particles uniformly from all interior surfaces of said hollow cathode target into said plasma;

ionizing said plasma;

extracting ions of said plasma through said magnetic null region;

directing a flow of extracted ions within said plasma toward a remote surface requiring thin film coverage;

creating an electrical field sheath potential between said plasma and said remote surface; and depositing said target material particles on said remote surface, said target material particles contacting said remote surface at an angle generally normal to said remote surface requiring thin film coverage.

11. A method for physical vapor deposition of a thin film comprising:

producing a magnetic field, said magnetic field looping through an opening in a hollow cathode target, said magnetic field resulting in a magnetic null region adjacent to said opening in said hollow cathode target, said producing a magnetic field step comprises stacking, alternately, equal strength magnets and spacers of varying thickness about an exterior wall of said hollow cathode target to alter profile of said magnetic field within a confining region of said hollow cathode target, said spacers increasing in thickness monotonically from a spacer closest to said closed end surface of said hollow cathode target to a spacer closest to said open side of said hollow cathode target;

drawing said magnetic field toward a closed end surface of said hollow cathode target by using a pole plate to draw and direct said magnetic field toward the closed end surface of said hollow cathode target;

introducing a plasma forming gas into a vacuum chamber and holding said plasma forming gas at low pressure;

applying an electrical potential across said hollow cathode target;

creating an electrical potential difference between said hollow cathode target and an anode resulting in an electrical field;

interacting said magnetic field and said electrical field to create magnetron action which generates a plasma within a [the] hollow region of said hollow cathode target;

ejecting target material particles uniformly from all interior surfaces of said hollow cathode target into said plasma;

ionizing said plasma;

extracting ions of said plasma through said magnetic null region;

directing a flow of extracted ions within said plasma toward a remote surface requiring thin film coverage;

creating an electrical field sheath potential between said plasma and said remote surface; and depositing said target material particles on said remote surface, said target material particles contacting said remote surface at an angle generally normal to said remote surface requiring thin film coverage.

12. A method for physical vapor deposition of a thin film comprising:

producing a magnetic field, said magnetic field looping through an opening in a hollow cathode target, said magnetic field resulting in a magnetic null region adjacent to said opening in said hollow cathode target, said producing a magnetic field step comprises using a tapered field magnet positioned about an exterior wall of said hollow cathode target to alter profile of the magnetic field within a confining region of said hollow cathode target, said tapered field magnet having maximum magnetic field strength closest to said closed end surface of said hollow cathode target and monotonically decreasing magnetic field strength approaching said open side of said hollow cathode target;

drawing said magnetic field toward a closed end surface of said hollow cathode target by using a pole plate to draw and direct said magnetic field toward the closed end surface of said hollow cathode target;

introducing a plasma forming gas into a vacuum chamber and holding said plasma forming gas at low pressure;

applying an electrical potential across said hollow cathode target;

creating an electrical potential difference between said hollow cathode target and an anode resulting in an electrical field;

interacting said magnetic field and said electrical field to create magnetron action which generates a plasma within a hollow region of said hollow cathode target;

ejecting target material particles uniformly from all interior surfaces of said hollow cathode target into said plasma;

ionizing said plasma;

extracting ions of said plasma through said magnetic null region;

directing a flow of extracted ions within said plasma toward a remote surface requiring thin film coverage;

creating an electrical field sheath potential between said plasma and said remote surface; and depositing said target material particles on said remote surface, said target material particles contacting said remote surface at an angle generally normal to said remote surface requiring thin film coverage.

13. A method for physical vapor deposition of a thin film comprising:

producing a magnetic field, said magnetic field looping through an opening in a hollow cathode target, said magnetic field resulting in a magnetic null region adjacent to said opening in said hollow cathode target;

said producing magnetic field further comprising using an extender magnet positioned atop and offset from a main magnetic field source, said extender magnet serving to extend said magnetic field beyond said opening in said hollow cathode target;

drawing said magnetic field toward a closed end surface of said hollow cathode target by using a pole plate to draw and direct said magnetic field toward the closed end surface of said hollow cathode target;

dispersing said magnetic field throughout a confining region of said hollow cathode target;

introducing a plasma forming gas into a vacuum chamber and holding said plasma forming gas at low pressure;

applying an electrical potential across said hollow cathode target;

creating an electrical potential difference between said hollow cathode target and an anode resulting in an electrical field;

interacting said magnetic field and said electrical field to create magnetron action which generates a plasma within a hollow region of said hollow cathode target;

ejecting target material particles uniformly from all interior surfaces of said hollow cathode target into said plasma;

ionizing said plasma;

extracting ions of said plasma through said magnetic null region;

directing a flow of extracted ions within said plasma toward a remote surface requiring thin film coverage;

creating an electrical field sheath potential between said plasma and said remote surface; and depositing said target material particles on said remote surface, said target material particles contacting said remote surface at an angle generally normal to said remote surface requiring thin film coverage.

14. A method for uniform erosion of a hollow cathode target comprising:

producing a magnetic field, said magnetic field looping through an opening in a hollow cathode target, said magnetic field resulting in a magnetic null region adjacent to said opening in said hollow cathode target, said producing a magnetic field step comprises stacking variable strength magnets about an exterior wall of said hollow cathode target to alter profile of the magnetic field within a confining region of said hollow cathode target, said variable strength magnets decreasing in magnetic field strength monotonically from a magnet closest to said closed end surface of said hollow cathode target to a magnet closest to said open side of said hollow cathode target;

drawing said magnetic field toward a closed end surface of said hollow cathode target by using a pole plate to draw and direct said magnetic field toward the closed end surface of said hollow cathode target;

applying an electrical potential across said hollow cathode target;

creating an electrical potential difference between said hollow cathode target and an anode resulting in an electrical field;

interacting said magnetic field and said electrical field to create magnetron action which generates a plasma within a hollow region of said hollow cathode target; and ejecting target material particles uniformly from all interior surfaces of said hollow cathode target.

15. A method for uniform erosion of a hollow cathode target comprising:

producing a magnetic field, said magnetic field looping through an opening in a hollow cathode target, said magnetic field resulting in a magnetic null region adjacent to said opening in said hollow cathode target, said producing a magnetic field step comprises stacking, alternately, equal strength magnets and spacers of varying thickness to alter profile of said magnetic field within a confining region of said hollow cathode target, said spacers increasing in thickness monotonically from a spacer closest to said closed end surface of said hollow cathode target to a spacer closest to said open side of said hollow cathode target;

drawing said magnetic field toward a closed end surface of said hollow cathode target by using a pole plate to draw and direct said magnetic field toward the closed end surface of said hollow cathode target;

applying an electrical potential across said hollow cathode target;

creating an electrical potential difference between said hollow cathode target and an anode resulting in an electrical field;

interacting said magnetic field and said electrical field to create magnetron action which generates a plasma within a hollow region of said hollow cathode target; and ejecting target material particles uniformly from all interior surfaces of said hollow cathode target.

16. A method for uniform erosion of a hollow cathode target comprising:

producing a magnetic field, said magnetic field looping through an opening in a hollow cathode target, said magnetic field resulting in a magnetic null region adjacent to said opening in said hollow cathode target, said producing a magnetic field step comprises using a tapered field magnet positioned about an exterior wall of said hollow cathode target to alter profile of the magnetic field within a confining region of said hollow cathode target, said tapered field magnet having maximum magnetic field strength closest to said closed end surface of said hollow cathode target and monotonically decreasing magnetic field strength approaching said open side of said hollow cathode target;

drawing said magnetic field toward a closed end surface of said hollow cathode target by using a pole plate to draw and direct said magnetic field toward the closed end surface of said hollow cathode target;

applying an electrical potential across said hollow cathode target;

creating an electrical potential difference between said hollow cathode target and an anode resulting in an electrical field;

interacting said magnetic field and said electrical field to create magnetron action which generates a plasma within a hollow region of said hollow cathode target; and ejecting target material particles uniformly from all interior surfaces of said hollow cathode target.

\* \* \* \* \*